United States Patent
Lee et al.

(10) Patent No.: US 9,786,530 B2
(45) Date of Patent: Oct. 10, 2017

(54) WAFER TRANSFER METHOD AND SYSTEM

(71) Applicant: TAIWAN SEMICONDUCTOR MANUFACTURING CO., LTD., Hsinchu (TW)

(72) Inventors: Chien-Fa Lee, Hsinchu (TW); Hsu-Shui Liu, Pingjhen (TW); Jiun-Rong Pai, Jhubei (TW); Shou-Wen Kuo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/518,373

(22) Filed: Oct. 20, 2014

(65) Prior Publication Data
US 2016/0111311 A1    Apr. 21, 2016

(51) Int. Cl.
H01L 21/67   (2006.01)
H01L 21/677   (2006.01)
H01L 21/68   (2006.01)

(52) U.S. Cl.
CPC .. *H01L 21/67259* (2013.01); *H01L 21/67265* (2013.01); *H01L 21/67778* (2013.01); *H01L 21/68* (2013.01)

(58) Field of Classification Search
CPC ............ H01L 21/67265; H01L 21/67778
See application file for complete search history.

(56) References Cited

U.S. PATENT DOCUMENTS

| | | | | |
|---|---|---|---|---|
| 5,783,834 A * | 7/1998 | Shatas | ............. | B25J 9/1656 250/559.29 |
| 6,356,091 B1 * | 3/2002 | Nimtz | ............. | H01L 21/681 356/614 |
| 6,438,460 B1 * | 8/2002 | Bacchi | ............. | H01L 21/6838 414/416.09 |
| 6,915,183 B2 * | 7/2005 | Iida | ............. | H01L 21/6715 414/939 |
| 6,927,181 B2 * | 8/2005 | Wakizako | ............. | B25J 9/042 29/25.01 |
| 7,275,905 B2 * | 10/2007 | Lee | ............. | H01L 21/67259 414/217 |
| 7,663,129 B1 * | 2/2010 | Lu | ............. | H01L 21/67265 250/223 R |
| 7,884,622 B2 * | 2/2011 | Doki | ............. | G03F 7/7075 324/658 |
| 8,029,224 B2 * | 10/2011 | Abe | ............. | H01L 21/67265 198/395 |
| 8,644,981 B2 * | 2/2014 | Itou | ............. | H01L 21/67265 700/214 |
| 8,892,242 B2 * | 11/2014 | Kimura | ............. | H01L 21/67265 414/796.4 |
| 9,184,080 B2 * | 11/2015 | Yoshida | ............. | H01L 21/67265 |
| 9,390,954 B2 * | 7/2016 | Kimura | ............. | H01L 21/67265 |
| 2007/0260341 A1 * | 11/2007 | Wu | ............. | H01L 21/67265 700/95 |

(Continued)

*Primary Examiner* — Thomas Randazzo
(74) *Attorney, Agent, or Firm* — Maschoff Brennan

(57) ABSTRACT

A wafer transfer method includes the following steps. An initial position of a first wafer in a wafer cassette is detected. A picking entry position in the wafer cassette is determined based on the initial position of the first wafer, in which the picking entry position is spaced apart from the initial position of the first wafer. A wafer transfer blade is moved to the picking entry position.

19 Claims, 12 Drawing Sheets

(56) References Cited

U.S. PATENT DOCUMENTS

2013/0074615 A1\* 3/2013 Sasaki ............... H01L 21/67772
  73/865.8
2014/0234058 A1\* 8/2014 Murata ............. H01L 21/67265
  414/222.01

\* cited by examiner

WAFER TRANSFER METHOD AND SYSTEM

BACKGROUND

Robotics is commonly used in the semiconductor manufacturing industry to transfer semiconductor wafers, also known as substrates, throughout the fabrication area. Wafer cassettes are typically used to retain a group of wafers. Many times throughout the manufacturing process, the individual semiconductor wafers may be loaded into or out of the wafer cassettes. Various robotic wafer transfer systems may be used. For example, the robotic wafer transfer systems typically utilize a wafer transfer blade that carries the individual wafers into and out of slots of the wafer cassette.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
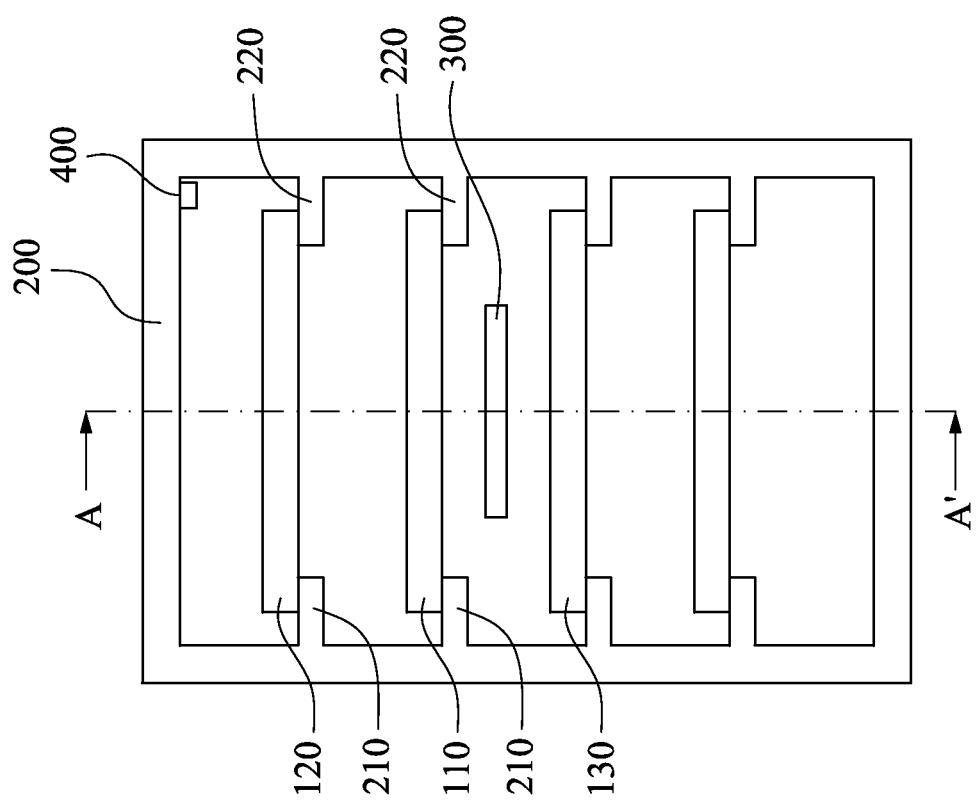
FIG. 1A is a front view of a wafer transfer system in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the disclosure or of any exemplified term. Likewise, the disclosure is not limited to various embodiments given in this specification.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Figure 1B:
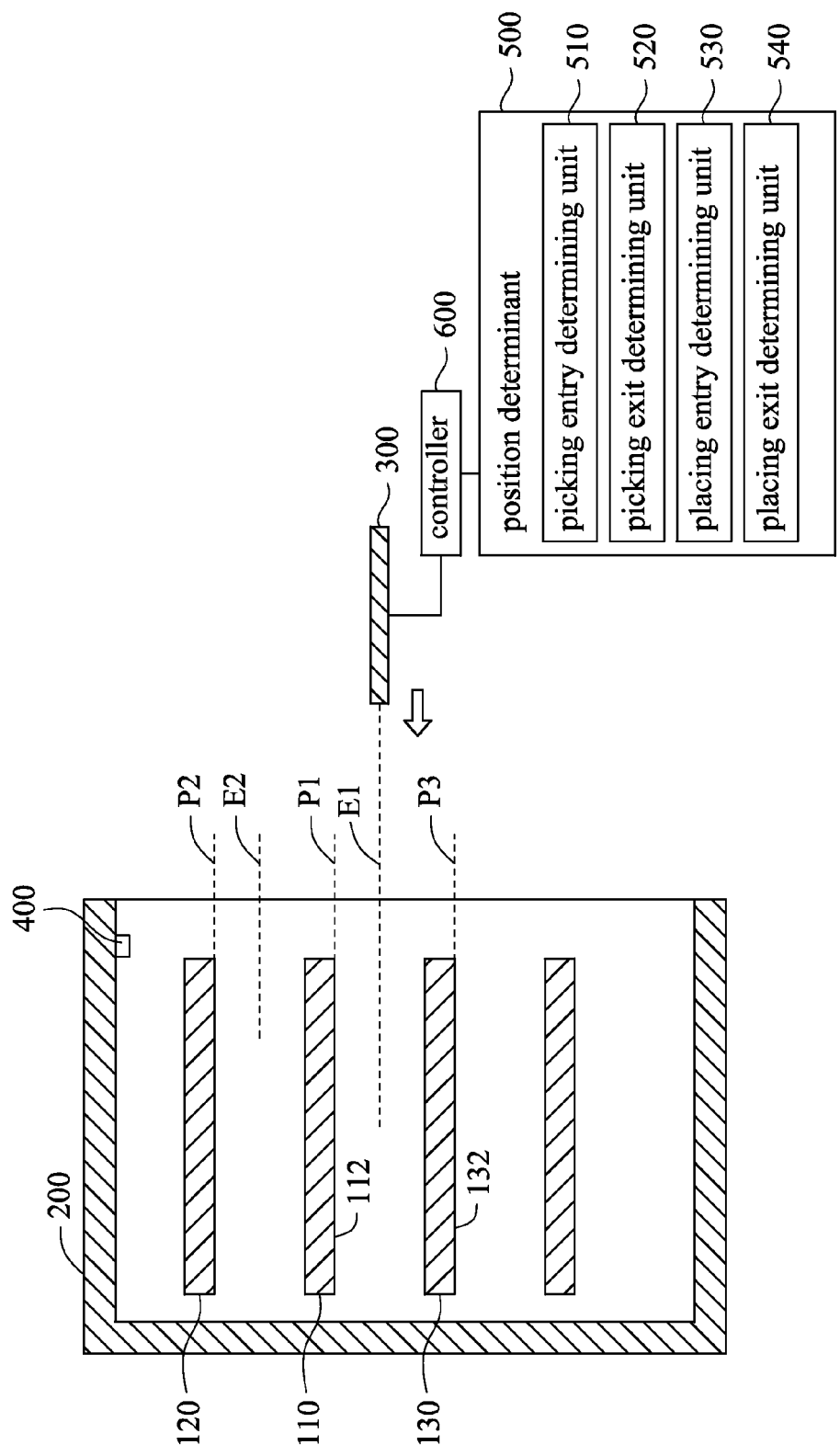
FIG. 1B is a cross-sectional view taken along A-A' line shown in FIG. 1A.

During a wafer transfer process, a wafer transfer blade is controlled to transfer individual wafers into and out of slots of a wafer cassette. In some semiconductor applications, a wafer is thinned, and this may cause the wafer warped. When the wafer is warped, the wafer transfer blade may scratch or shatter the wafer, which may disperse particles contaminating other wafers in the wafer cassette. As a result, in various embodiments, the wafer transfer blade is controlled to transfer the wafer in consideration of a detected position of the wafer. FIG. 1A is a front view of a wafer transfer system in accordance with various embodiments of the present disclosure, and FIG. 1B is a cross-sectional view taken along A-A' line shown in FIG. 1A. As shown in FIGS. 1A and 1B, a wafer cassette 200 at least retains a first wafer 110, a second wafer 120 and a third wafer 130. In particular, the wafer cassette 200 includes a plurality of first supporting ribs 210 arranged vertically at intervals and a plurality of second supporting ribs 220 arranged vertically at intervals. The first supporting ribs 210 and the second supporting ribs 220 are respectively protruded on two inner walls of the wafer cassette 200 facing to each other. Each of the first wafer 110, the second wafer 120 and the third wafer 130 can be supported by one first supporting rib 210 and one second supporting rib 220 at the same height, so that the first wafer 110, the second wafer 120 and the third wafer 130 can be retained in a spaced apart manner. The wafer transfer system in accordance with various embodiments of the present disclosure at least transfers the first wafer 110, the second wafer 120 and the third wafer 130 out of and/or into the wafer cassette 200. For example, as shown in FIG. 1B, the wafer transfer system includes a wafer transfer blade 300, a wafer mapping sensor 400, a position determinant 500 and a controller 600. The wafer mapping sensor 400 is configured to detect an initial position P1 of the first wafer 110 in a wafer cassette 200, and thereby generates a mapping data with respect to the first wafer 110 in the wafer cassette 200. This initial position P1 is the position of the first wafer 110 when the first wafer 110 is initially retained in the wafer cassette 200. In other words, the initial position P1 is the position of the first wafer 110 when the first wafer 110 has not been moved by the wafer transfer blade 300 and has not been moved out of the wafer cassette 200. The position determinant 500 is electrically coupled to the wafer mapping sensor 400, so that the position determinant 500 obtains the mapping data with respect to the first wafer 110 and is informed about the initial position P1 of the first wafer 110. The position determinant 500 includes a picking entry determining unit 510. The picking entry determining unit 510 is configured to determine a picking entry position E1 in the wafer cassette 200 based on the initial position P1 of the first wafer 110. In other words, the picking entry determining unit 510 can determine the picking entry position E1 based on the mapping data with respect to the first wafer 110 generated by the wafer mapping sensor 400. The picking entry position E1 is spaced apart from the initial position P1 of the first wafer 110. In other words, the picking entry position E1 deviates from the first wafer 110. More particularly, the picking entry position E1 is lower than the initial position P1 of the first wafer 110. The controller 600 is electrically coupled to the position determinant 500 and the wafer transfer blade 300, and is configured to move the wafer transfer blade 300 to the picking entry position E1. More particularly, the controller 600 moves the wafer transfer blade 300 from an exterior with respect to the wafer cassette 200 to the picking entry position E1 in the wafer cassette 200.

By such a method to determine the picking entry position E1, the picking entry position E1 is spaced apart from the detected initial position P1 of the first wafer 110, so the wafer transfer blade 300 will not rub the first wafer 110 when the wafer transfer blade 300 moves into the wafer cassette 200, and therefore, the first wafer 110 will not be scratched or shattered by the wafer transfer blade 300 even if, in various embodiments, the first wafer 110 is warped.

In various embodiments, as shown in FIG. 1B, the third wafer 130 is located below the first wafer 110, and the wafer mapping sensor 400 is further configured to detect a position P3 of the third wafer 130, and thereby generates a mapping data with respect to the third wafer 130. The picking entry determining unit 510 obtains the mapping data with respect to the third wafer 130 and is informed about the position P3 of the third wafer 130. The picking entry determining unit 510 is configured to choose one position between the initial position P1 of the first wafer 110 and the position P3 of the third wafer 130 to be the picking entry position E1. In other words, the picking entry determining unit 510 chooses one position that deviates from the first wafer 110 and the third wafer 130 to be the picking entry position E1 based on the mapping data with respect to the first wafer 110 and the mapping data with respect to the third wafer 130. More particularly, the picking entry determining unit 510 chooses one position higher than the position P3 of the third wafer 130 and lower than the initial position P1 of the first wafer 110 to be the picking entry position E1.

By such a method to determine the picking entry position E1, the wafer transfer blade 300 will not rub both the first wafer 110 and the third wafer 130 when the wafer transfer blade 300 moves into the wafer cassette 200, and therefore, both the first wafer 110 and the third wafer 130 will not be scratched or shattered by the wafer transfer blade 300 even if, in various embodiments, the first wafer 110, the third wafer 130 or both of them are warped.

In various embodiments, as shown in FIG. 1B, the picking entry position E1 is determined based on an initial vertical distance between the first wafer 110 and the third wafer 130. The initial vertical distance between the first wafer 110 and the third wafer 130 is the vertical distance measured from the bottom of the first wafer 110 to the top of the third wafer 130 when the first wafer 110 has not been moved by the wafer transfer blade 300. For example, in various embodiments, the wafer mapping sensor 400 detects the initial position P1 of a point on a bottom surface 112 of the first wafer 110, and thereby obtains a vertical coordinate value V_P1 with respect to this point on the bottom surface 112. The wafer mapping sensor 400 also detects the position P3 of a point on a bottom surface 132 of the third wafer 130, and thereby obtains a vertical coordinate value V_P3 with respect to this point on the bottom surface 132. Moreover, the wafer mapping sensor 400 detects the thickness of the third wafer 130, and thereby obtains a thickness value V_T3 with respect to the third wafer 130. The picking entry determining unit 510 determines the picking entry position E1 based on the vertical coordinate values V_P1 and V_P3 and the thickness value V_T3. For example, the vertical coordinate value V_E1 with respect to the picking entry position E1 may satisfy $V\_E1 = V\_P1 + (V\_P3 - V\_T3 - V\_P1)/2$. By such an equation, the picking entry position E1 is located at the central location of the interval between the first wafer 110 and the third wafer 130, which allows the wafer transfer blade 300 to move into the wafer cassette 200 without rubbing the first wafer 110 and the third wafer 130.

Figure 2A:
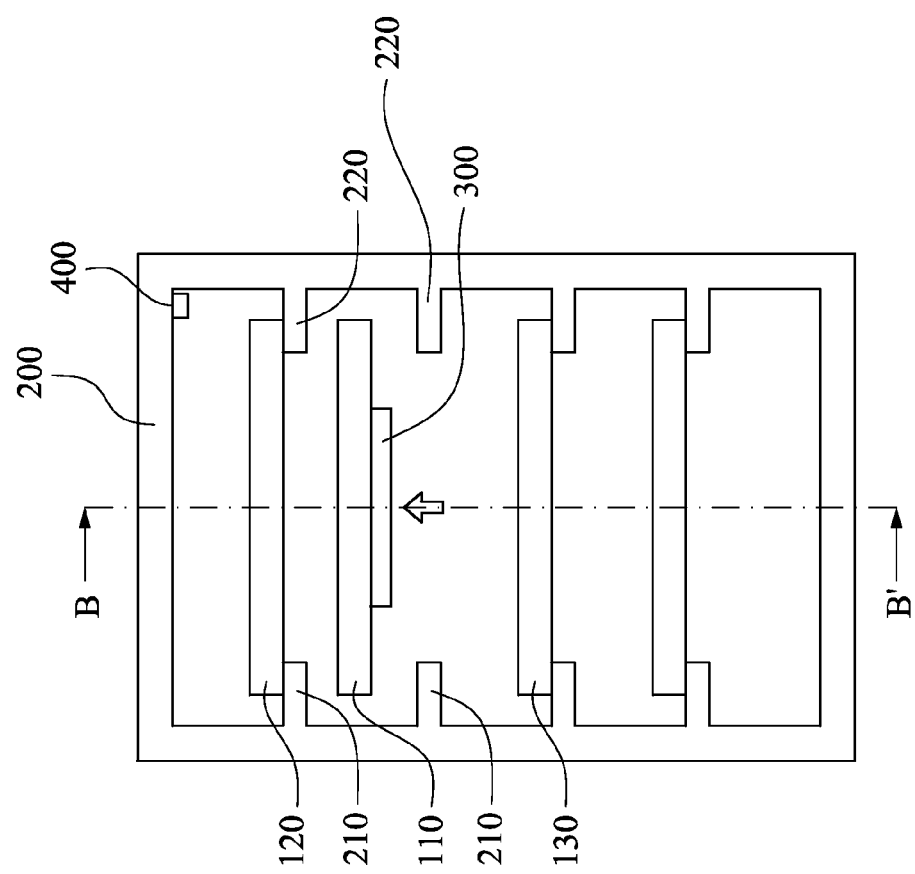
FIG. 2A is a front view of the wafer transfer system at the step next to the step performed in FIG. 1A during the wafer transfer process.
Figure 2B:
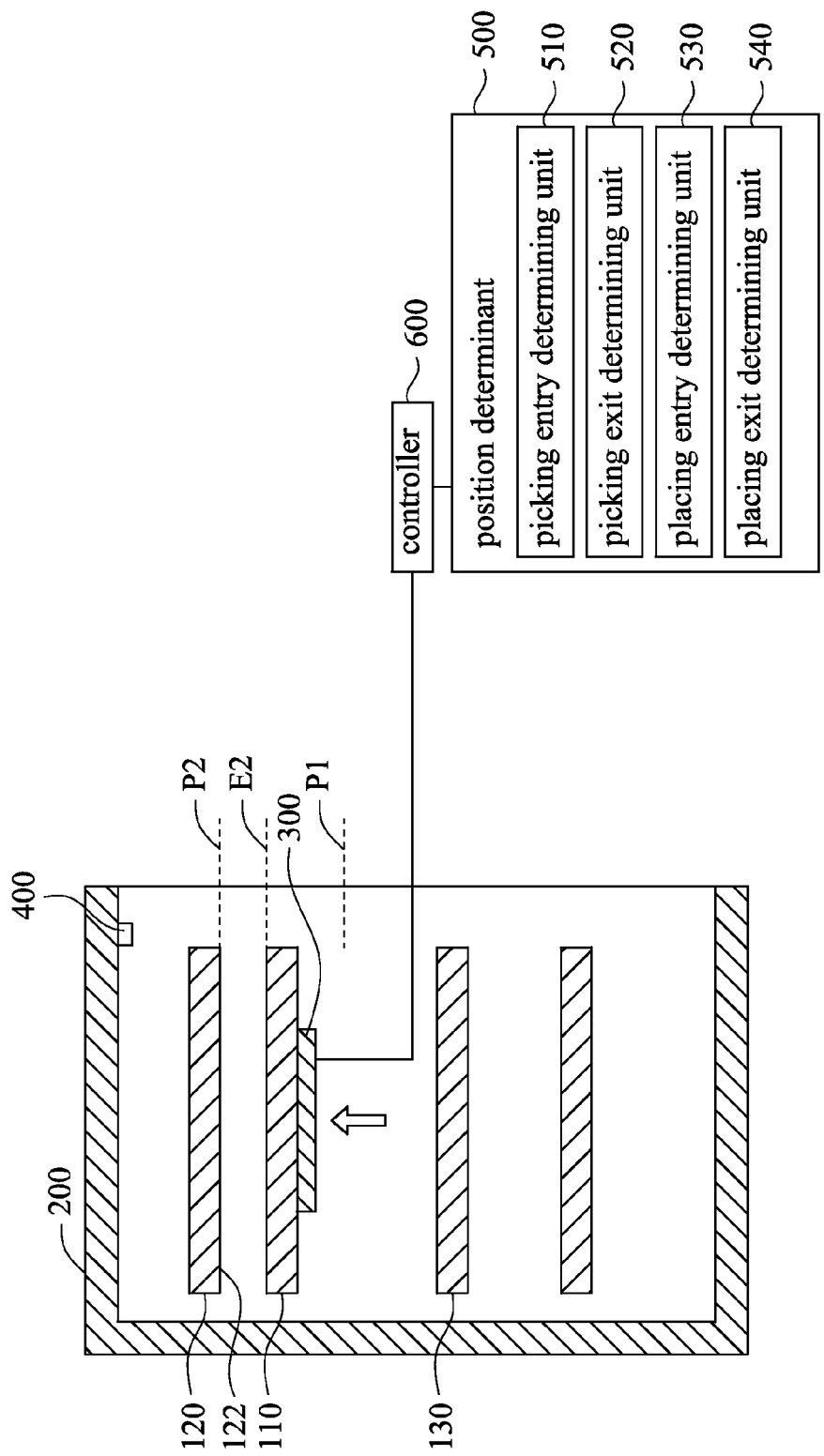
FIG. 2B is a cross-sectional view taken along B-B' line shown in FIG. 2A.

FIG. 2A is a front view of the wafer transfer system at the step next to the step performed in FIG. 1A during the wafer transfer process. FIG. 2B is a cross-sectional view taken along B-B' line shown in FIG. 2A. As shown in FIGS. 2A and 2B, the wafer transfer blade 300 lifts the first wafer 110. In particular, the controller 600 moves the wafer transfer blade 300 upwardly, so that the wafer transfer blade 300 touches the first wafer 110. Then, the controller 600 keeps moving the wafer transfer blade 300 upwardly, and therefore, the wafer transfer blade 300 can lift the first wafer 110, so that the first wafer 110 can depart from the first supporting rib 210 and the second supporting rib 220 that initially support the first wafer 110.

In various embodiments, as shown in FIG. 2B, the second wafer 120 is located above the first wafer 110, and the first wafer 110 is lifted to a picking exit position E2 at which the first wafer 110 will not touch the second wafer 120. Then, the first wafer 110 is moved out of the wafer cassette 200. More particularly, the wafer mapping sensor 400 is further configured to detect a position P2 of the second wafer 120, and thereby generates a mapping data with respect to the second wafer 120. The position determinant 500 further includes a picking exit determining unit 520. The picking exit determining unit 520 obtains the mapping data with respect to the first wafer 110 and the mapping data with respect to the second wafer 120, so that the picking exit determining unit 520 is informed about the initial position P1 of the first wafer 110 and the position P2 of the second wafer 120. The picking exit determining unit 520 is configured to determine the picking exit position E2 in the wafer cassette 200 based on the initial position P1 of the first wafer 110 and the position P2 of the second wafer 120. In other words, the picking exit determining unit 520 is configured to determine the picking exit position E2 based on the mapping data with respect to the first wafer 110 and the mapping data with respect to the second data 120. The picking exit position E2 is located between the initial position P1 of the first wafer 110 and the position P2 of the second wafer 120. In other words, the picking exit position E2 deviates from the second wafer 120. More particularly, the picking exit position E2 is higher than the initial position P1 of the first wafer 110 and lower than the position P2 of the second wafer 120.

By such a method to determine the picking exit position E2, the first wafer 110 will not rub the second wafer 120 when the first wafer 110 is moved out of the wafer cassette 200 by the wafer transfer blade 300, and therefore, the first wafer 110 and the second wafer 120 will not be scratched or shattered by each other even if, in various embodiments, the first wafer 110, the second wafer 120 or both of them are warped.

In various embodiments, as shown in FIG. 2B, the picking exit position E2 is determined based on an initial vertical distance between the first wafer 110 and the second wafer 120. The initial vertical distance between the first wafer 110 and the second wafer 120 is the vertical distance measured from the top of the first wafer 110 to the bottom of the second wafer 120 when the first wafer 110 has not been moved by the wafer transfer blade 300. For example, in various embodiments, the wafer mapping sensor 400 detects the position P2 of a point on a bottom surface 122 of the second wafer 120, and thereby obtains a vertical coordinate value V_P2 with respect to this point on the bottom surface 122. Moreover, the wafer mapping sensor 400 detects a thickness of the first wafer 110, and thereby obtains a thickness value V_T1 with respect to the first wafer 110. The picking exit determining unit 520 determines the picking exit position E2 based on the vertical coordinate values V_P1 and V_P2 and the thickness value V_T1. For example, the vertical coordinate value V_E2 with respect to the picking exit position E2 may satisfy $V\_E2 = V\_P2 + (V\_P1 - V\_T1 - V\_P2)/2$. By such an equation, the picking exit position E2 is located at the central location of the interval between the first wafer 110 and the second wafer 120 when the first wafer 110 has not been moved, which allows the wafer transfer blade 300 to transfer the first wafer 110 out of the wafer cassette 200 without rubbing the second wafer 120 even if, in some embodiments, the first wafer 110, the second wafer 120 or both of them are warped.

Figure 3:
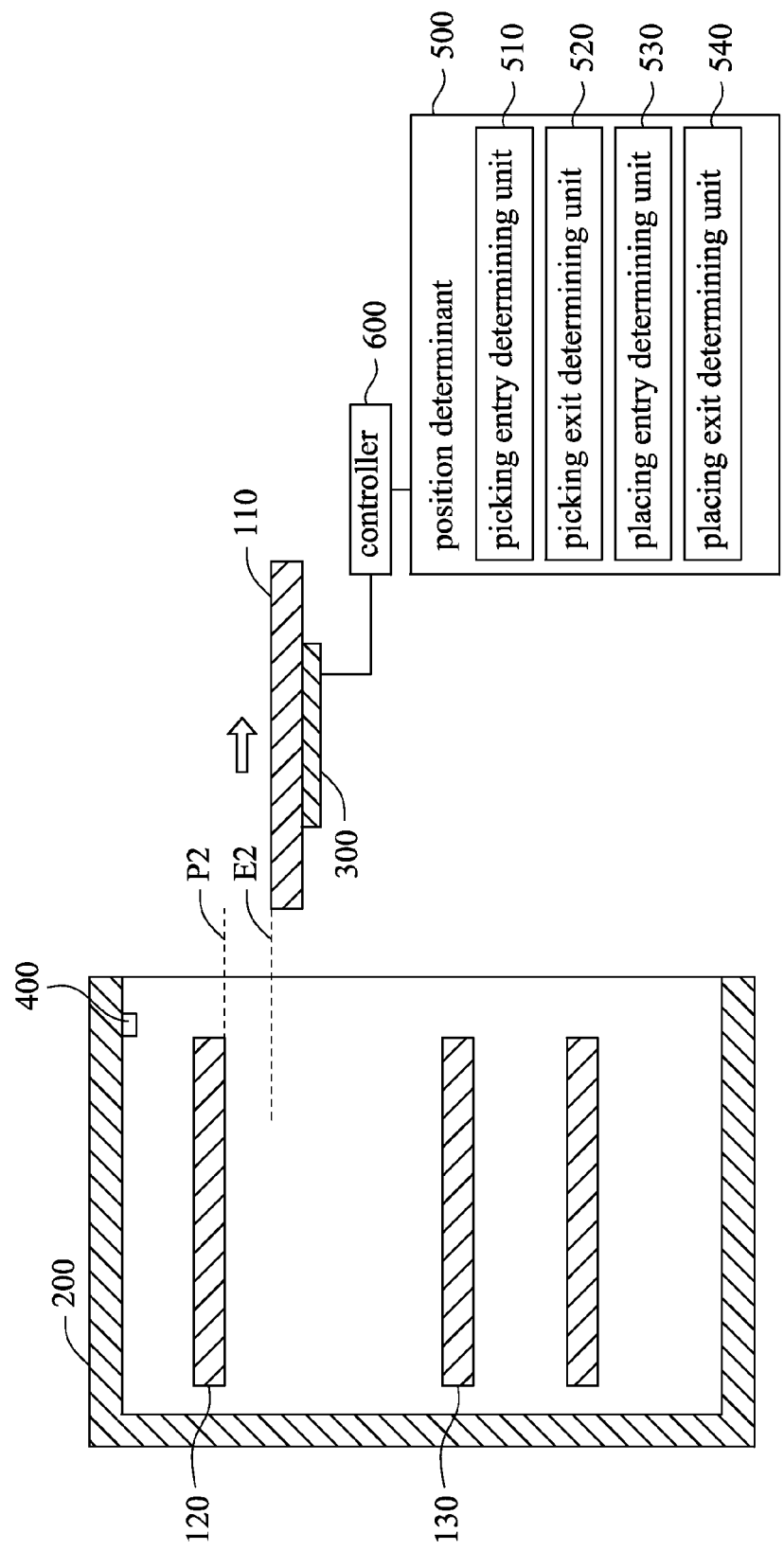
FIG. 3 is a cross-sectional view of the wafer transfer system at the step next to the step performed in FIG. 2B during the wafer transfer process.

FIG. 3 is a cross-sectional view of the wafer transfer system at the step next to the step performed in FIG. 2B during the wafer transfer process. As shown in FIG. 3, the controller 600 is further configured to move the wafer transfer blade 300 out of the wafer cassette 200, so that the first wafer 110 lifted by the wafer transfer blade 300 can be moved out of the wafer cassette 200 along with the wafer transfer blade 300, and thus, the first wafer 110 can be moved to various manufacturing stages.

Figure 4A:
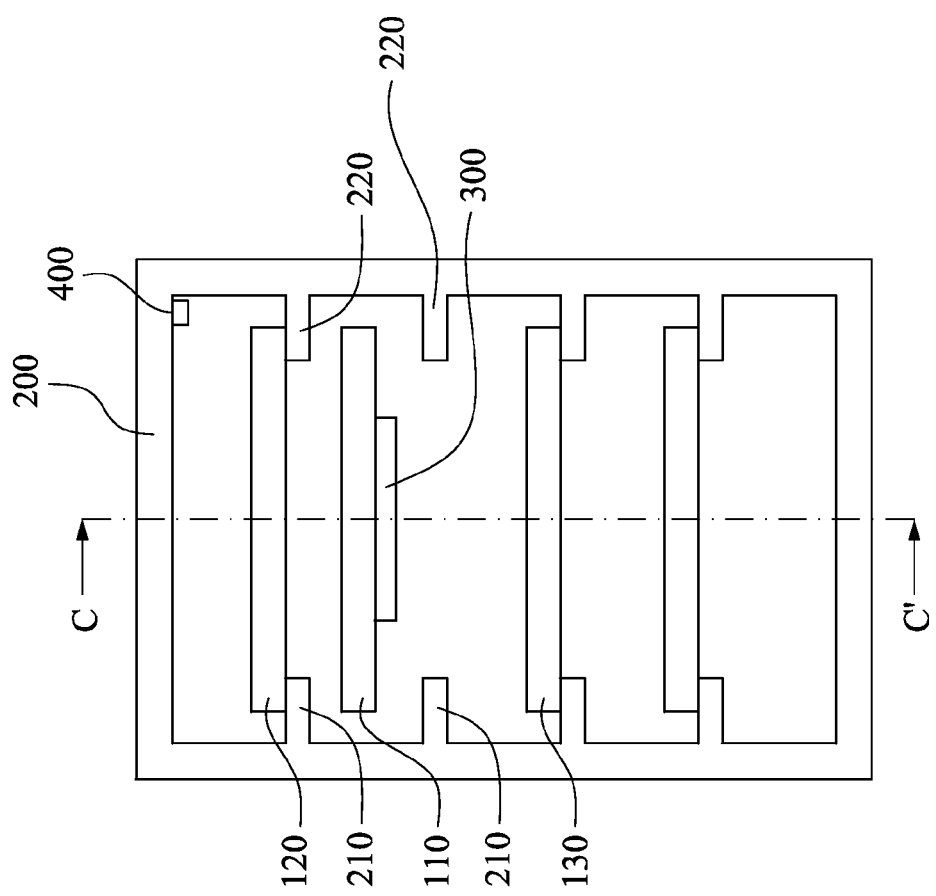
FIG. 4A is a front view of the wafer transfer system at the step after the step performed in FIG. 3 during the wafer transfer process.
Figure 4B:
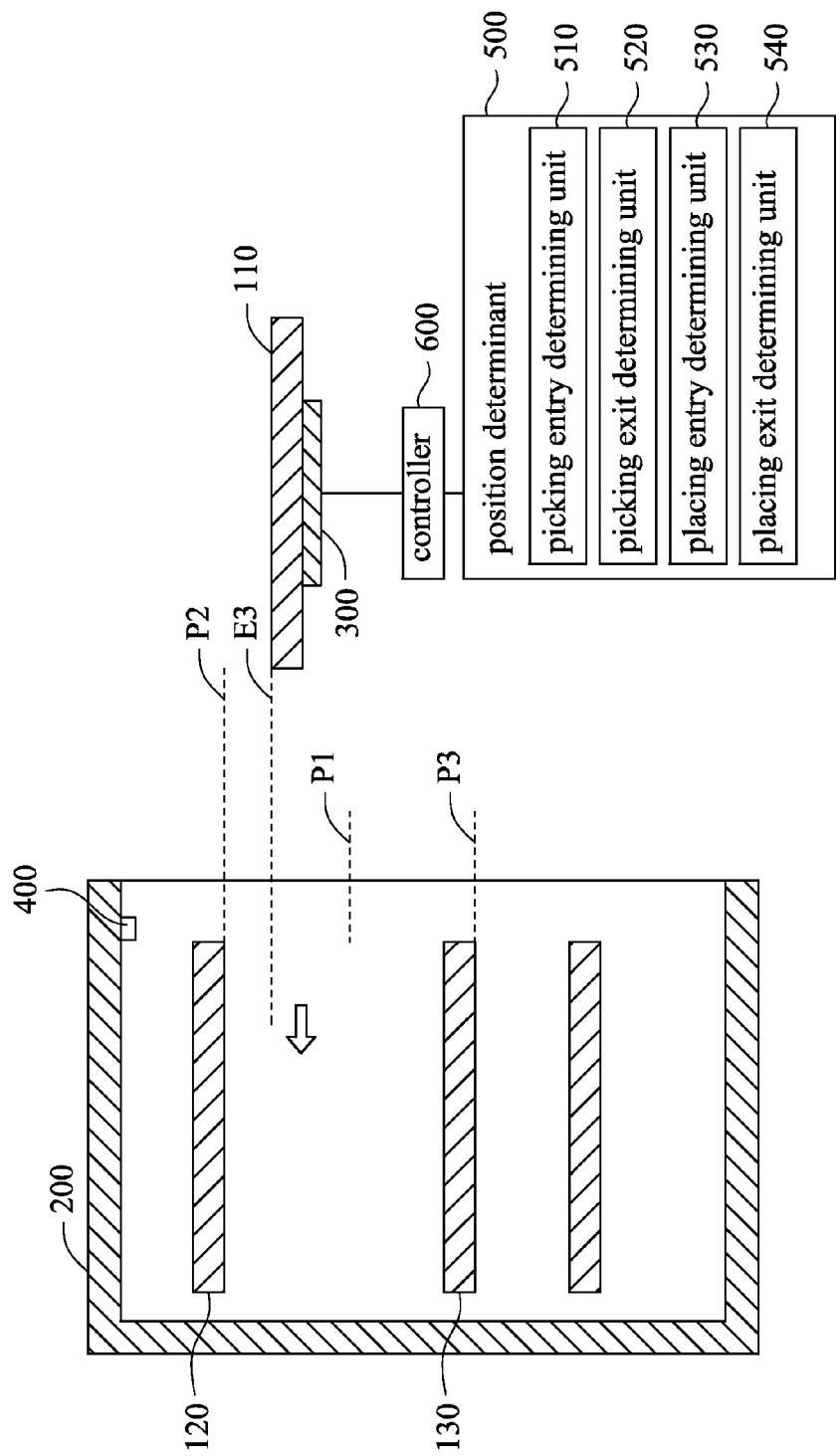
FIG. 4B is a cross-sectional view taken along C-C' line shown in FIG. 4A.

FIG. 4A is a front view of the wafer transfer system at the step after the step performed in FIG. 3 during the wafer transfer process. FIG. 4B is a cross-sectional view taken along C-C' line shown in FIG. 4A. As shown in FIGS. 4A and 4B, the controller 600 is further configured to control the wafer transfer blade 300, carrying the first wafer 110 thereon, to move into the wafer cassette 200. In particular, the wafer transfer blade 300 moves the first wafer 110 from the exterior with respect to the wafer cassette 200 to a placing entry position E3 at which the first wafer 110 will not touch the second wafer 120. More particularly, the position determinant 500 further includes a placing entry determining unit 530. The placing entry determining unit 530 obtains the mapping data with respect to the second wafer 120, and is informed about the position P2 of the second wafer 120. The placing entry determining unit 530 is configured to determine the placing entry position E3 in the wafer cassette 200 based the position P2 of the second wafer 120, in which the placing entry position E3 is spaced apart from the position P2 of the second wafer 120. In other words, the placing entry determining unit 530 determines the placing entry position E3 that deviates from the second wafer 120 based on the mapping data with respect to the second wafer 120. More particularly, the placing entry position E3 is lower than the position P2 of the second wafer 120.

By such a method to determine placing entry position E3, the placing entry position E3 is spaced apart from the position of the second wafer P2, so the first wafer 110 on the wafer transfer blade 300 will not rub the second wafer 120 when the wafer transfer blade 300 moves into the wafer cassette 200, and therefore, the first wafer 110 and the second wafer 120 will not be scratched or shattered by each other even if, in various embodiments, the first wafer 110, the second wafer 120, or both of them are warped.

In various embodiments, as shown in FIG. 4B, the placing entry determining unit 530 is configured to choose one position between the position P2 of the second wafer 120 and the initial position P1 of the first wafer 110 to be the placing entry position E3. In other words, the placing entry determining unit 530 chooses one position that deviates from the second wafer 120 and the first wafer 110 when the first wafer 110 has not been moved out of the wafer cassette 200 (i.e. when the first wafer 110 is located at the position as shown in FIG. 1A), and makes the chosen position be the placing entry position E3 based on the mapping data with respect to the first wafer 110 and the mapping data with respect to the second wafer 120. More particularly, the placing entry determining unit 530 chooses one position higher than the initial position P1 of the first wafer 110 and lower than the position P2 of the second wafer 120 to be the placing entry position E3.

By such a method to determine the placing entry position E3, referring to FIG. 4A, the wafer transfer blade 300 is able to place the first wafer 110 onto the first supporting rib 210 and second supporting rib 220 because the placing entry position E3 is higher than the first supporting rib 210 and the second supporting rib 220.

In various embodiments, as shown in FIG. 4B, the placing entry position E3 is determined based on an initial vertical distance between the first wafer 110 and the second wafer 120. For example, in various embodiments, the placing entry determining unit 530 determines the placing entry position E3 based on the vertical coordinate values V_P1 and V_P2 and the thickness value V_T1. For example, the vertical coordinate value V_E3 with respect to the placing entry position E3 may satisfy $V\_E3 = V\_P2 + (V\_P1 - V\_T1 -$ V_P2)/2. By such an equation, the placing entry position E3 is located at the central location of the interval between the first wafer 110 and the second wafer 120 when the first wafer 110 has not been moved, which allows the first wafer 110 to move into the wafer cassette 200 without rubbing the second wafer 120, the first supporting rib 210 and the second supporting rib 220. The vertical coordinate values V_P1 and V_P2 and the thickness value V_T1 are described in the foregoing description, and therefore, they are not described repeatedly herein.

Figure 5A:
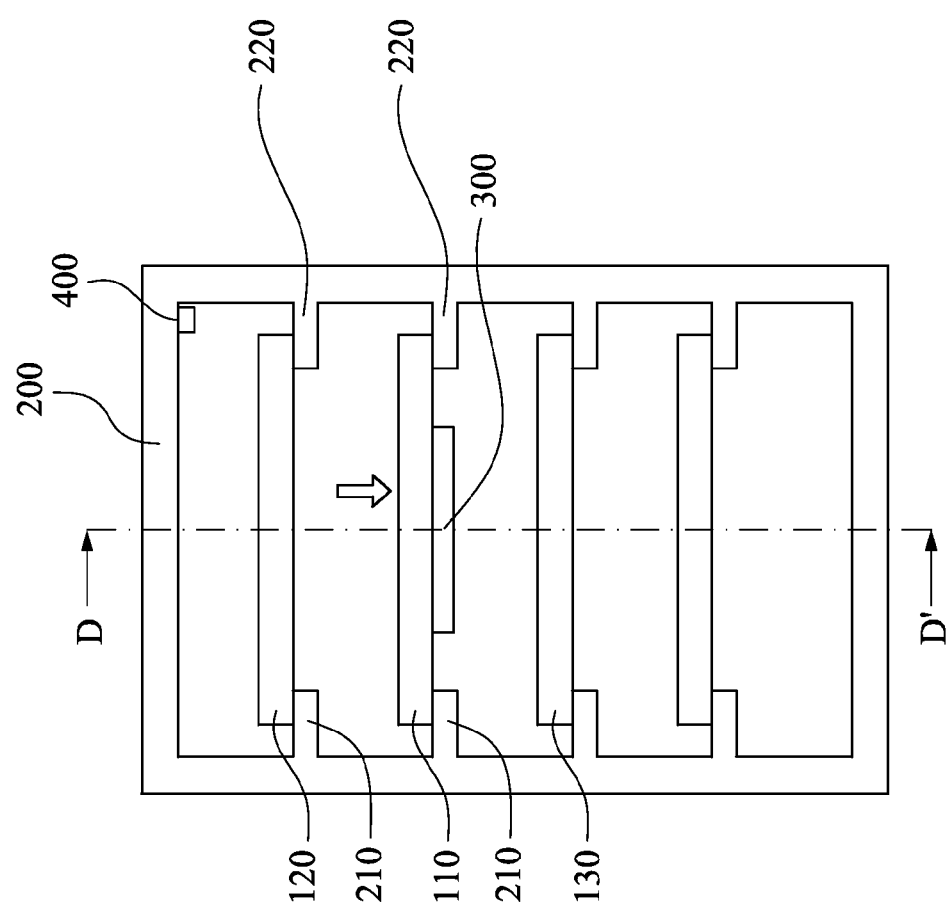
FIG. 5A is a front view of the wafer transfer system at the step next to the step performed in FIG. 4A during the wafer transfer process.
Figure 5B:
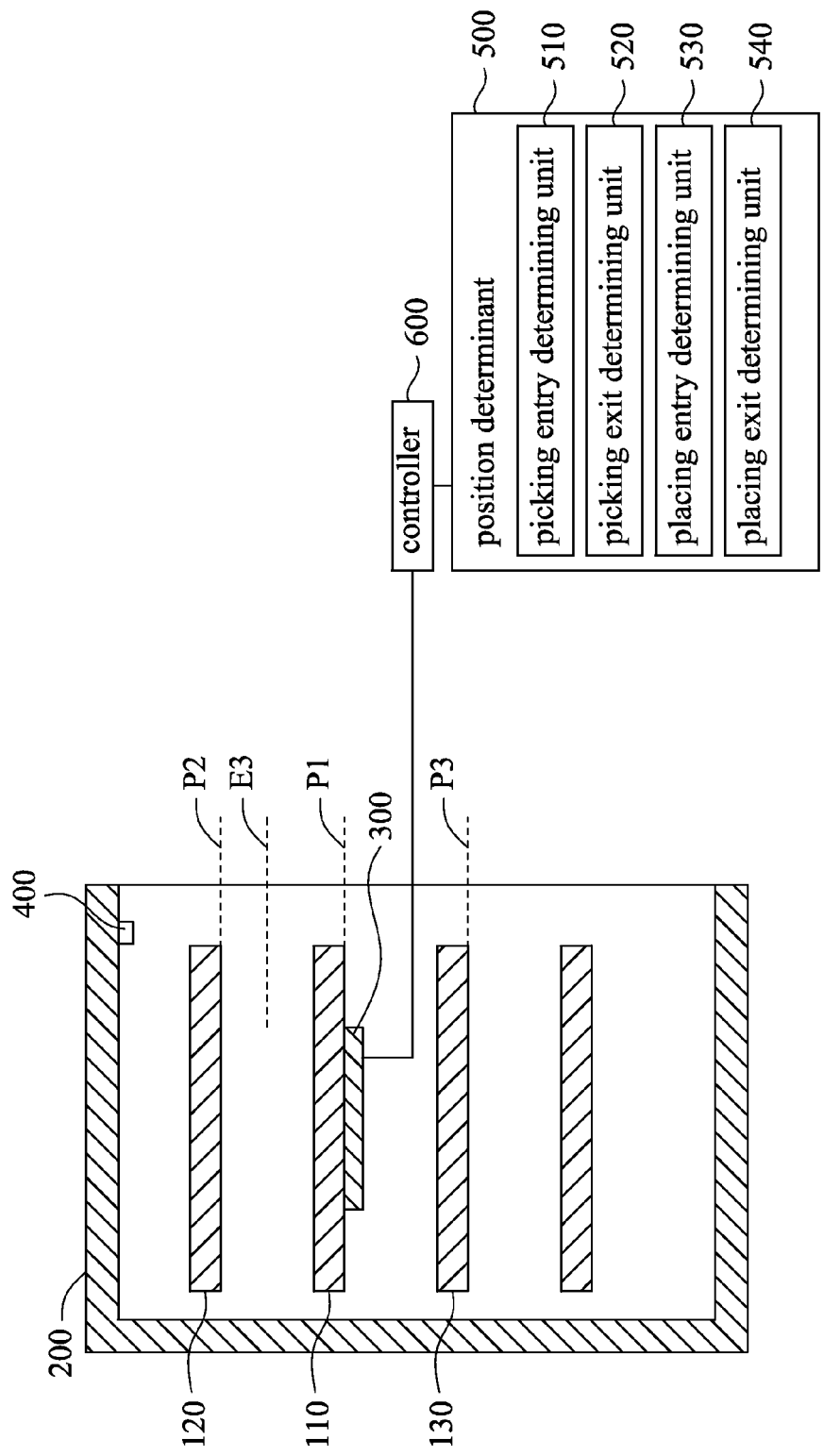
FIG. 5B is a cross-sectional view taken along D-D' line shown in FIG. 5A.

FIG. 5A is a front view of the wafer transfer system at the step next to the step performed in FIG. 4A during the wafer transfer process. FIG. 5B is a cross-sectional view taken along D-D' line shown in FIG. 5A. As shown in FIGS. 5A and 5B, the controller 600 moves the wafer transfer blade 300 downwardly to lower the first wafer 110 based on the mapping data with respect to the first wafer 110. In other words, the controller 600 moves the wafer transfer blade 300 downwardly to place the first wafer 110 onto the initial position P1 of the first wafer 110, so that the first wafer 110 can be supported by the first supporting rib 210 and the second supporting rib 220 that initially support the first wafer 110. As such, the first wafer 110 can be steadily retained in the wafer cassette 200.

Figure 6A:
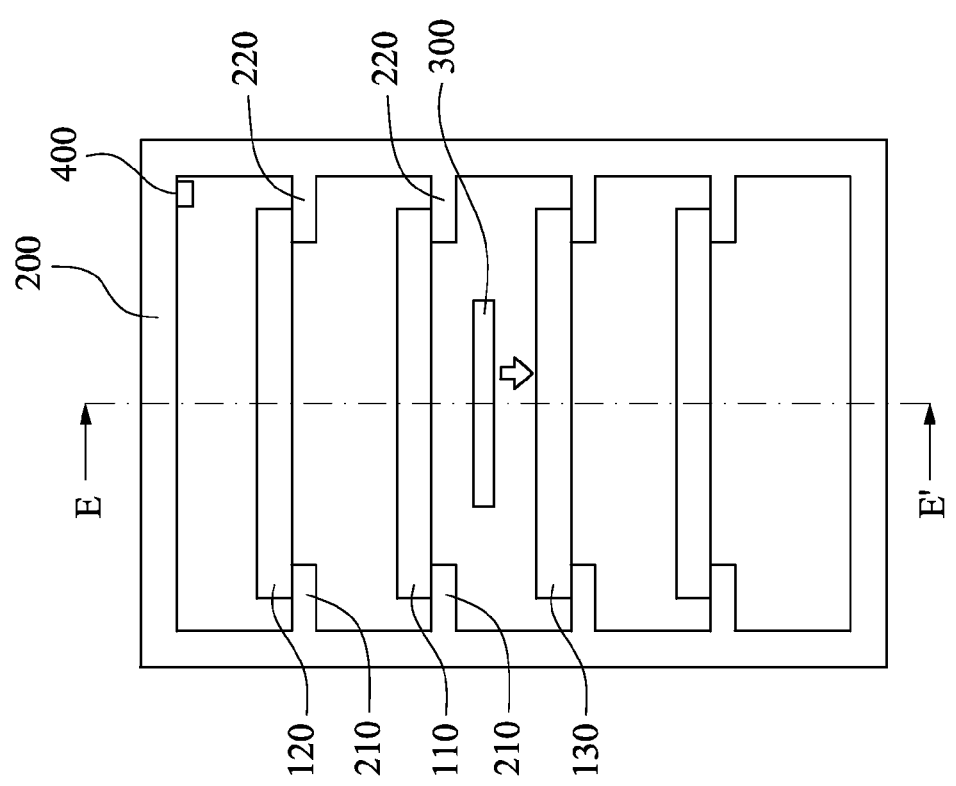
FIG. 6A is a front view of the wafer transfer system at the step next to the step performed in FIG. 5A during the wafer transfer process.
Figure 6B:
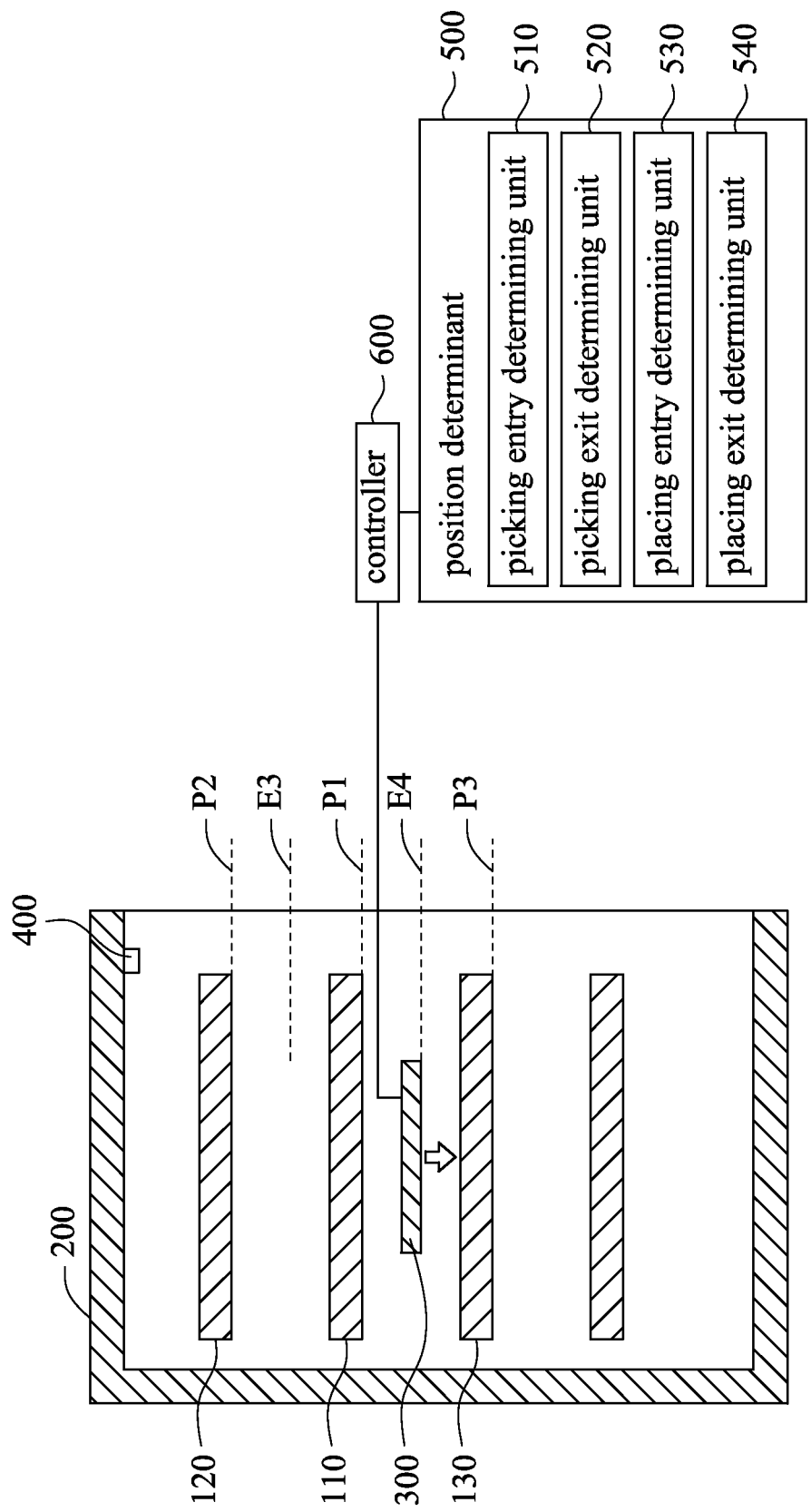
FIG. 6B is a cross-sectional view taken along E-E' line shown in FIG. 6A.

FIG. 6A is a front view of the wafer transfer system at the step next to the step performed in FIG. 5A during the wafer transfer process. FIG. 6B is a cross-sectional view taken along E-E' line shown in FIG. 6A. After the first wafer 110 is placed onto the initial position P1 of the first wafer 110, the controller 600 keeps moving the wafer transfer blade 300 downwardly to a placing exit position E4 at which the wafer transfer blade 300 will not touch the third wafer 130 located below the first wafer 110. Then, the controller 600 may move the wafer transfer blade 300 out of the wafer cassette 200 without rubbing the third wafer 130.

For example, in various embodiments, the position determinant 500 further includes a placing exit determining unit 540. The placing exit determining unit 540 obtains the mapping data with respect to the first wafer 110 and the mapping data with respect to the third wafer 130, and therefore, the placing exit determining unit 540 is informed about the initial position P1 of the first wafer 110 and the position P3 of the third wafer 130. The placing exit determining unit 540 is configured to determine the placing exit position E4 in the wafer cassette 200 based the initial position P1 of the first wafer 110 and the position P3 of the third wafer 130, in which the placing exit position E4 is located between the initial position P1 of the first wafer 110 and the position P3 of the third wafer 130. In other words, the placing exit determining unit 540 determines the placing exit position E4 that deviates from the first wafer 110 and the third wafer 130 based on the mapping data with respect to the first wafer 110 and the mapping data with respect to the third wafer 130. More particularly, the placing exit position E4 is lower than the initial position P1 of the first wafer 110 and higher than the position P3 of the third wafer 130.

By such a method to determine the placing exit position E4, the wafer transfer blade 300 will not rub the third wafer 130 when the wafer transfer blade 300 moves from the placing exit position E4 to the exterior with respect to the wafer cassette 200. Therefore, the third wafer 130 will not be scratched or shattered by the wafer transfer blade 300 even if, in various embodiments, the third wafer 130 is warped. Moreover, because the placing exit position E4 is lower than the initial position P1 of the first wafer 110, the wafer transfer blade 300 can be moved out of the wafer cassette 200 after the first wafer 110 is placed onto the initial position P1 of the first wafer 110 and supported by the first supporting rib 210 and the second supporting rib 220.

In various embodiments, the placing exit position E4 is determined based on an initial vertical distance between the first wafer 110 and the third wafer 130. For example, in various embodiments, the placing exit determining unit 540 determines the placing exit position E4 based on the vertical coordinate values V_P1 and V_P3 and the thickness value V_T3. For example, the vertical coordinate value V_E4 with respect to the placing exit position E4 may satisfy $V\_E4=V\_P1+(V\_P3-V\_T3-V\_P1)/2$. By such an equation, the placing exit position E4 is located at the central location of the interval between the first wafer 110 and the third wafer 130, which allows the wafer transfer blade 300 to move out of the wafer cassette 200 without rubbing the third wafer 130. The vertical coordinate values V_P1 and V_P3 and the thickness value V_T3 are described in the foregoing description, and therefore, they are not described repeatedly herein.

Figure 7:
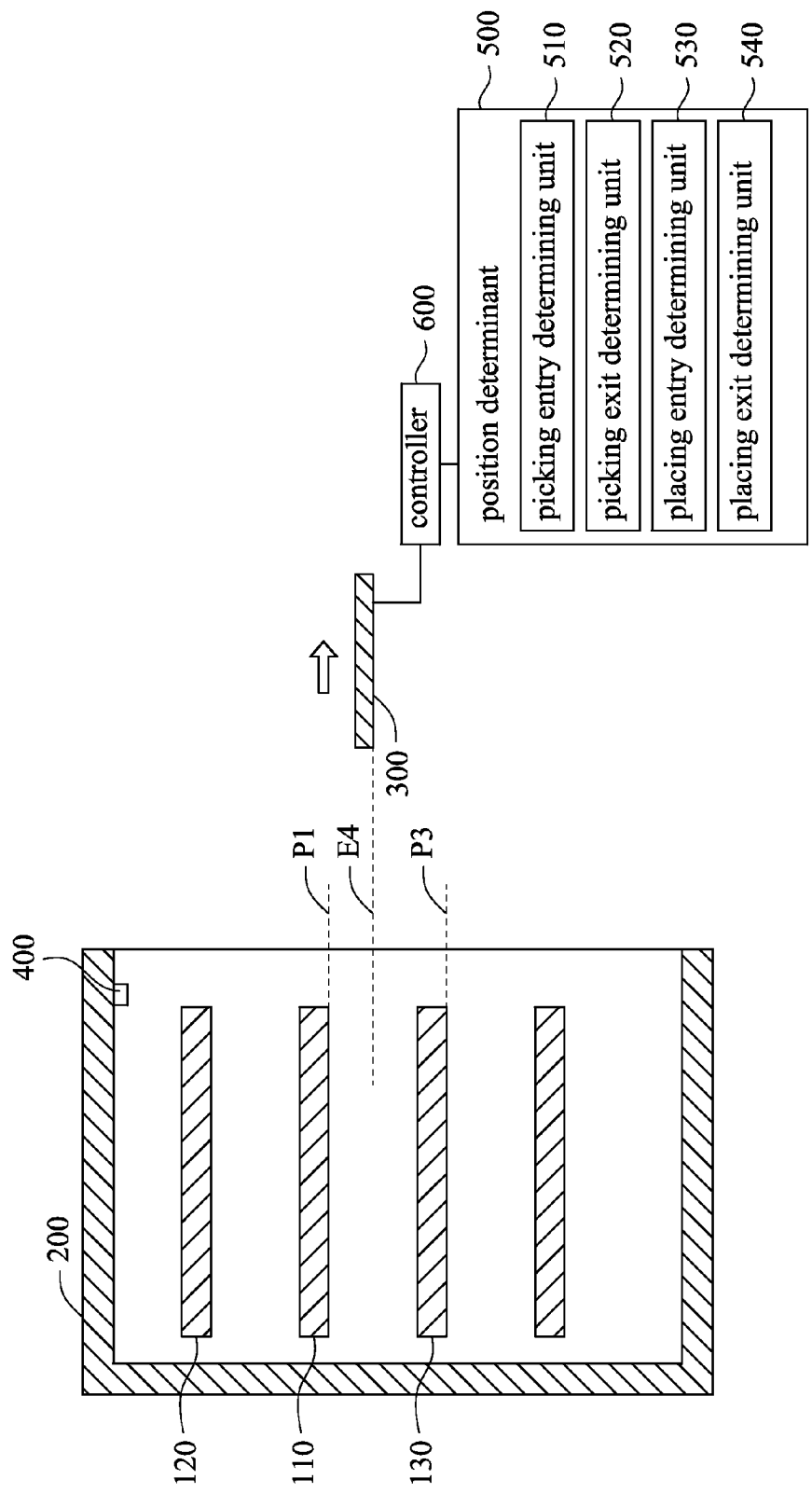
FIG. 7 is a cross-sectional view of the wafer transfer system at the step next to the step performed in FIG. 6B during the wafer transfer process.

FIG. 7 is a cross-sectional view of the wafer transfer system at the step next to the step performed in FIG. 6B during the wafer transfer process. As shown in FIG. 7, the controller 600 is further configured to move the wafer transfer blade 300 from the placing exit position E4 to the exterior with respect to the wafer cassette 200. At this step, the wafer transfer process is completed.

In various embodiments, the wafer mapping sensor 400 detects the first wafer 110, the second wafer 120 and the third wafer 130 and generates corresponding mapping data before the first wafer 110 has been moved by the wafer transfer blade 300. In various embodiments, the wafer mapping sensor 400 may be disposed inside the wafer cassette 200. In various embodiments, the wafer mapping sensor 400 may be disposed on a load port that loads the wafer cassette 200. In various embodiments, the wafer mapping sensor 400 may be disposed on the wafer transfer blade 300. In various embodiments, the position determinant 500 may be implemented by a processor or a computer that is able to calculate a desired vertical coordinate value based on the data obtained by the wafer mapping sensor 400. In various embodiments, the wafer transfer blade 300 grips the first wafer 110 such as by use of a vacuum.

The present disclosure provides a wafer transfer method. During the process to move out the first wafer, the wafer transfer blade is moved to a picking entry position that is determined based on the initial position of the first wafer. In particular, the picking entry position is spaced apart from the initial position of the first wafer. As a result, when the wafer transfer blade moves into the cassette to reach the picking entry position, the first wafer will not be rubbed by the wafer transfer blade even if the first wafer is warped.

In various embodiments, a wafer transfer method is disclosed that includes the following steps. An initial position of a first wafer in a wafer cassette is detected. A picking entry position in the wafer cassette is determined based on the initial position of the first wafer, in which the picking entry position is spaced apart from the initial position of the first wafer. A wafer transfer blade is moved to the picking entry position.

In various embodiments, also disclosed is a wafer transfer method that includes the following steps. A mapping data with respect to a first wafer in a wafer cassette is obtained. A picking entry position that deviates from the first wafer is determined based on the mapping data. The wafer transfer blade is moved to the picking entry position.

In various embodiments, also disclosed is a wafer transfer system that includes a wafer mapping sensor, a picking entry determining unit, a wafer transfer blade and a controller. The wafer mapping sensor is configured to detect an initial position of a first wafer in a wafer cassette. A picking entry determining unit is configured to determine a picking entry position in the wafer cassette based on the initial position of the first wafer, in which the picking entry position is lower than the initial position of the first wafer. The controller is configured to move the wafer transfer blade to the picking entry position.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer transfer method, comprising:
   moving a wafer transfer blade to a picking entry position in a wafer cassette, the wafer transfer blade controlled by a controller;
   detecting, by a wafer mapping sensor, an initial position of a first wafer and a position of a second wafer in the wafer cassette
   determining, by a picking exit determining unit, an initial distance between the initial position of the first wafer and the position of the second wafer that is positioned at a level higher than that of the first wafer in the wafer cassette;
   determining, by the picking exit determining unit, a picking exit position in the wafer cassette by using at least the initial distance between the initial position of the first wafer and the position of the second wafer that is positioned at the level higher than that of the first wafer in the wafer cassette; and
   moving the wafer transfer blade from the picking entry position to the picking exit position to lift the first wafer to the picking exit position to allow for removal of the first wafer from the wafer cassette.

2. The wafer transfer method of claim 1, further comprising:
   determining the picking entry position in the wafer cassette based on the initial position of the first wafer, wherein the picking entry position is spaced apart from the initial position of the first wafer.

3. The wafer transfer method of claim 1, further comprising:
   detecting a position of a third wafer located below the first wafer; and
   choosing one position between the initial position of the first wafer and the position of the third wafer to be the picking entry position.

4. The wafer transfer method of claim 3, wherein the picking entry position is determined based on an initial vertical distance between the first wafer and the third wafer.

5. The wafer transfer method of claim 1, further comprising:
   moving the first wafer out of the wafer cassette;
   determining a placing entry position in the wafer cassette based on the position of the second wafer, wherein the placing entry position is spaced apart from the position of the second wafer; and
   moving the first wafer which has been moved out of the wafer cassette to the placing entry position.

6. The wafer transfer method of claim 5, wherein determining the placing entry position comprises:
   choosing one position between the position of the second wafer and the initial position of the first wafer to be the placing entry position.

7. The wafer transfer method of claim 6, wherein the placing entry position is determined based on an initial vertical distance between the second wafer and the first wafer.

8. The wafer transfer method of claim 5, further comprising:
   placing the first wafer onto the initial position of the first wafer;
   detecting a position of a third wafer located below the first wafer;
   determining a placing exit position based on the initial position of the first wafer and the position of the third wafer, wherein the placing exit position is located between the initial position of the first wafer and the position of the third wafer; and
   moving the wafer transfer blade to the placing exit position.

9. A wafer transfer method, comprising:
   moving a wafer transfer blade to a picking entry position in a wafer cassette, the wafer transfer blade controlled by a controller;
   obtaining, using a wafer mapping sensor, mapping data with respect to a first wafer and a second wafer in the wafer cassette;
   determining, by a picking exit determining unit, an initial vertical distance between the first wafer and the second wafer that is located at a height higher than where the first wafer is located in the wafer cassette based on the mapping data;
   determining, by the picking exit determining unit, a picking exit position in the wafer cassette by using at least the initial vertical distance between the first wafer and the second wafer that is located on the height higher than where the first wafer is located in the wafer cassette; and
   moving the wafer transfer blade from the picking entry position to the picking exit position to lift the first wafer to the picking exit position to allow for removal of the first wafer from the wafer cassette.

10. The wafer transfer method of claim 9, further comprising:
    obtaining mapping data with respect to a third wafer located below the first wafer; and
    choosing one position that deviates from the first wafer and the third wafer to be the picking entry position based on the mapping data with respect to the first wafer and the mapping data with respect to the third wafer.

11. The wafer transfer method of claim 9, further comprising:
    determining the picking entry position that deviates from the first wafer based on the mapping data with respect to the first wafer.

12. The wafer transfer method of claim 9, further comprising:
    moving the first wafer out of the wafer cassette;
    determining a placing entry position in the wafer cassette that deviates from the second wafer based on the mapping data with respect to the second wafer; and moving the first wafer which has been moved out of the wafer cassette to the placing entry position.

13. The wafer transfer method of claim 12, wherein determining the placing entry position comprises:
choosing one position that deviates from the second wafer and the first wafer when the first wafer has not been moved out of the wafer cassette to be the placing entry position based on the mapping data with respect to the first wafer and the mapping data with respect to the second wafer.

14. The wafer transfer method of claim 12, further comprising:
lowering the first wafer based on the mapping data with respect to the first wafer;
obtaining mapping data with respect to a third wafer located below the first wafer;
determining a placing exit position that deviates from the first wafer and the third wafer based on the mapping data with respect to the first wafer and the mapping data with respect to the third wafer;
lowering the wafer transfer blade to the placing exit position; and
moving the wafer transfer blade out of the wafer cassette.

15. A wafer transfer system, comprising:
a wafer mapping sensor configured to detect an initial position of a first wafer and a position of a second wafer in a wafer cassette;
a picking exit determining unit configured to determine a picking exit position in the wafer cassette by using at least an initial distance between the initial position of the first wafer and the position of the second wafer that is located at a height higher than where the first wafer is located in the wafer cassette;
a wafer transfer blade; and
a controller configured to move the wafer transfer blade to lift the first wafer to the picking exit position to allow for removal of the first wafer from the wafer cassette.

16. The wafer transfer system of claim 15, wherein the wafer mapping sensor is further configured to detect a position of a third wafer located below the first wafer, and the wafer transfer system further comprises a picking entry determining unit configured to choose one position higher than the position of the third wafer and lower than the initial position of the first wafer to be a picking entry position.

17. The wafer transfer system of claim 15, further comprising:
a picking entry determining unit configured to determine a picking entry position in the wafer cassette based on the initial position of the first wafer, wherein the picking entry position is lower than the initial position of the first wafer.

18. The wafer transfer system of claim 15, further comprising:
a placing entry determining unit configured to determine a placing entry position in the wafer cassette based the position of the second wafer, wherein the placing entry position is lower than the position of the second wafer, wherein the wafer transfer blade is configured to move the first wafer from an exterior with respect to the wafer cassette to the placing entry position.

19. The wafer transfer system of claim 18, wherein the wafer mapping sensor is further configured to detect a position of a third wafer located below the first wafer, and the wafer transfer system further comprises:
a placing exit determining unit configured to determine a placing exit position in the wafer cassette based the initial position of the first wafer and the position of the third wafer, wherein the placing exit position is lower than the initial position of the first wafer and higher than the position of the third wafer, wherein the controller is further configured to move the wafer transfer blade from the placing exit position to the exterior with respect to the wafer cassette.

\* \* \* \* \*